United States Patent
Narayanan et al.

(10) Patent No.: US 11,073,557 B2
(45) Date of Patent: Jul. 27, 2021

(54) PHASE CONTROLLED CODEC BLOCK SCAN OF A PARTITIONED CIRCUIT DEVICE

(71) Applicant: TEXAS INSTRUMENTS INCORPORATED, Dallas, TX (US)

(72) Inventors: Prakash Narayanan, Bangalore (IN); Wilson Pradeep, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 39 days.

(21) Appl. No.: 16/406,858

(22) Filed: May 8, 2019

(65) Prior Publication Data

US 2020/0355744 A1 Nov. 12, 2020

(51) Int. Cl.
*G01R 31/3185* (2006.01)
*G01R 31/3177* (2006.01)
*G01R 31/317* (2006.01)

(52) U.S. Cl.
CPC . *G01R 31/318536* (2013.01); *G01R 31/3177* (2013.01); *G01R 31/31721* (2013.01); *G01R 31/318541* (2013.01); *G01R 31/318544* (2013.01); *G01R 31/318552* (2013.01); *G01R 31/318575* (2013.01)

(58) Field of Classification Search
CPC ...... G01R 31/318536; G01R 31/31721; G01R 31/3177; G01R 31/318541; G01R 31/318544; G01R 31/318552; G01R 31/318575
USPC .................................. 714/726, 727, 729, 731
See application file for complete search history.

(56) References Cited

U.S. PATENT DOCUMENTS

| | | | |
|---|---|---|---|
| 6,327,687 B1* | 12/2001 | Rajski | G01R 31/318335 714/738 |
| 6,681,357 B2 | 1/2004 | Pendurkar | |
| 6,901,544 B1* | 5/2005 | Huth | G01R 31/318544 714/727 |
| 7,484,151 B2* | 1/2009 | Balakrishnan | G01R 31/31921 714/726 |
| 7,610,540 B2* | 10/2009 | Balakrishnan | G01R 31/31921 703/13 |
| 8,205,125 B2 | 6/2012 | Hales et al. | |
| 8,627,161 B2 | 1/2014 | Whetsel | |
| 9,261,560 B2* | 2/2016 | Mittal | G01R 31/318552 |
| 9,535,123 B2* | 1/2017 | Mittal | G01R 31/3177 |
| 10,088,525 B2* | 10/2018 | Kawoosa | G01R 31/3177 |

(Continued)

OTHER PUBLICATIONS

Chloupek et al., Scan Chain Configuration Method for Broadcast Decompressor Architecture, 2011, IEEE, pp. 1-5. (Year: 2011).*

(Continued)

*Primary Examiner* — John J Tabone, Jr.
(74) *Attorney, Agent, or Firm* — Ebby Abraham; Charles A. Brill; Frank D. Cimino (57) ABSTRACT

A circuit device is provided with a first codec including a first portion of a logic circuit and a second codec including a second portion of the logic circuit. The circuit device can also include a plurality of first scan chains coupled to the first codec and configured to shift a delayed test vector onto the first codec, wherein the delayed test vector is a test vector with a phase delay. A plurality of second scan chains can be coupled to the second codec and configured to shift the test vector onto the second codec.

12 Claims, 6 Drawing Sheets

(56) References Cited

U.S. PATENT DOCUMENTS

| | | | | |
|---|---|---|---|---|
| 10,338,136 | B2* | 7/2019 | Wang | G01R 31/31725 |
| 2003/0204802 | A1* | 10/2003 | Sim | G01R 31/2891 |
| | | | | 714/726 |
| 2004/0187058 | A1* | 9/2004 | Yamada | G01R 31/318572 |
| | | | | 714/726 |
| 2004/0268181 | A1* | 12/2004 | Wang | G01R 31/318594 |
| | | | | 714/30 |
| 2005/0028060 | A1* | 2/2005 | Dervisoglu | G01R 31/318572 |
| | | | | 714/726 |
| 2008/0010573 | A1* | 1/2008 | Sul | G01R 31/318541 |
| | | | | 714/731 |
| 2008/0222471 | A1* | 9/2008 | Sul | G01R 31/318575 |
| | | | | 714/731 |
| 2009/0113230 | A1* | 4/2009 | Ito | G01R 31/318552 |
| | | | | 713/500 |
| 2009/0119563 | A1* | 5/2009 | Balakrishnan | G01R 31/31921 |
| | | | | 714/739 |
| 2009/0125771 | A1* | 5/2009 | Duggal | G01R 31/318594 |
| | | | | 714/731 |
| 2009/0307548 | A1* | 12/2009 | Forlenza | G01R 31/318533 |
| | | | | 714/729 |
| 2010/0205492 | A1* | 8/2010 | Sinanoglu | G01R 31/318335 |
| | | | | 714/729 |
| 2010/0211839 | A1* | 8/2010 | Almukhaizim | G06F 11/267 |
| | | | | 714/729 |
| 2012/0030532 | A1* | 2/2012 | Jain | G01R 31/318547 |
| | | | | 714/726 |
| 2012/0036532 | A1 | 2/2012 | Ellis et al. | |
| 2014/0189452 | A1* | 7/2014 | Sonawane | G01R 31/318552 |
| | | | | 714/727 |
| 2014/0189455 | A1* | 7/2014 | Sonawane | G01R 31/318552 |
| | | | | 714/731 |
| 2015/0006987 | A1* | 1/2015 | Narayanan | G01R 31/318536 |
| | | | | 714/729 |
| 2015/0185283 | A1* | 7/2015 | Mittal | G01R 31/318552 |
| | | | | 714/731 |
| 2016/0169966 | A1* | 6/2016 | Abshishek | G01R 31/318541 |
| | | | | 714/727 |
| 2016/0266201 | A1* | 9/2016 | Waayers | G01R 31/318594 |
| 2016/0266202 | A1* | 9/2016 | Mittal | G01R 31/3177 |
| 2016/0349318 | A1* | 12/2016 | Pereira | G01R 31/318552 |
| 2017/0115352 | A1* | 4/2017 | Jayaraman | G01R 31/318555 |
| 2017/0234925 | A1* | 8/2017 | Kawoosa | G01R 31/31723 |
| | | | | 714/727 |
| 2018/0059178 | A1* | 3/2018 | Wang | G01R 31/31723 |
| 2020/0174069 | A1* | 6/2020 | Narayanan | G01R 31/318547 |

OTHER PUBLICATIONS

Lin et al., Power Aware Embedded Test, 2011, IEEE, pp. 511-516. (Year: 2011).*

Wang et al., UltraScan: Using Time-Division Demultiplexing/ Multiplexing (TDDM/TDM) with VirtualScan for Test Cost Reduction, 2005, IEEE, pp. 1-8. (Year: 2005).*

* cited by examiner

PHASE CONTROLLED CODEC BLOCK SCAN OF A PARTITIONED CIRCUIT DEVICE

SUMMARY

In accordance with at least one example of the disclosure, a circuit device can include a first codec including a first portion of a logic circuit and a second codec including a second portion of the logic circuit. The circuit device can also include a plurality of first scan chains coupled to the first codec and configured to shift a delayed test vector onto the first codec, wherein the delayed test vector is a test vector with a phase delay. A plurality of second scan chains can be coupled to the second codec and configured to shift the test vector onto the second codec.

In accordance with at least another example of the disclosure, a system can include a first plurality of memory elements placed into N number of segments and arranged between a scan input bus and a first scan output bus, wherein N is an integer greater than one. A second plurality of memory elements can be placed into the N number of segments and arranged between the scan input bus and a second scan output bus. A counter circuit can be configured to receive a scan clock, wherein the scan clock transitions at a scan clock rate in which test vector data is clocked onto the scan input bus. The counter circuit can also be configured to divide the scan clock by N to produce an odd clock and an even clock, and to delay the even clock by approximately one cycle of the odd clock divided by N. A first portion of a logic circuit can be coupled to the first scan output bus and having a plurality of first internal scan chains arranged between a first compressor and a first decompressor to receive a shifted test vector data, wherein the shifted test vector data is clocked onto the scan input bus shifted by the even clock. A second portion of the logic circuit can be coupled to the second scan output bus and having a plurality of second internal scan chains arranged between a second compressor and a second decompressor to receive a shifted data, wherein the shifted data is clocked onto the scan input bus shifted by the odd clock.

In accordance with at least another example of the disclosure, a method can include receiving a test pattern synchronized to a scan clock transitioning at a scan clock rate; latching in a delayed test pattern across a plurality of first scan chains, wherein the delayed test pattern is the test pattern with a delay; latching the test pattern across a plurality of second scan chains; decompressing the test pattern from the plurality of first scan chains onto a first plurality of internal scan chains of a first portion of the logic circuit; decompressing the test pattern from the plurality of second scan chains onto a first plurality of internal scan chains of a second portion of the logic circuit; compressing the test pattern from the first and second plurality of scan chains as test response values; and comparing the test response values to corresponding expected response values to determine pass or fail of a logic circuit.

BRIEF DESCRIPTION OF THE DRAWINGS

For a detailed description of various examples, reference will now be made to the accompanying drawings in which.

DETAILED DESCRIPTION

An electronic device can be tested either during production or in the field. The electronic device can include one or more integrated circuits. Scan architectures that use scan bits and scan chains can be used to test the electronic device. A sequence of logic ones and zeros may be aligned into a scan chain placed as a scan path into the electronic device, or circuit, being tested.

An electronic device in a control module of an automobile, for example, should adhere to strict safety regulations. The scan chains may be used for in-the-field self-test of the electronic device. Each time the electronic device, or circuit, is powered on (when the vehicle is started), testing may be performed within a defined time period in order to assure correct operation. Self-test time governs the total boot-up time which should fit within a specified application time interval during application mode operation. The self-test time is mainly governed by frequency of operation and efficiency at which the scan data is applied to scan chains of the circuit. For instance, consider an integrated circuit with maximum frequency of 100 MHz and functional worst case switching activity of 25%. In this example, running the scan (e.g., 1100 pattern sequence) at 100 MHz may cause 50% switching activity and thereby doubles the power consumption. Hence, the maximum scan frequency may be limited to 50 MHz in order not to exceed power dissipation limits. For a given pattern set, running the tests at 50 MHz as opposed to 100 MHz may double the test-time and application time.

Testing an electronic device can use scan chains placed on scan paths. The scan paths can be configured in a low power architecture that requires lower operational power during testing. It is advantageous to use the low power scan architecture to test an integrated circuit, or die, during manufacture of that die. A large number of circuits, such as Central Processing Units (CPU) core circuits can be tested in parallel without unduly consuming power. Because the low power scan architecture reduces test power consumption, it is possible to simultaneously test more dies on a wafer. This allows wafer test time to be reduced, which reduces the manufacturing cost of each die on the wafer.

After manufacture, field testing or self-testing is often done during circuit device boot-up. Self-test times may also be reduced.

Scan chain testing, either during manufacture or thereafter during self-test, can include Frequency Scaled Segmented (FSS) scan. FSS scanning allows for a two-fold increase in the clock scan frequency applied by the tester to the Device Under Test (DUT). Each scan chain can be separated into two segments and the scan clock can be applied to each segment. The scan clock frequency for each segment can be increased up to N-fold increase within each of the N segments within a chain. When two segments are used, the FSS scan approach involves test vector data sent from a tester via a test access port. Data is latched through the scan chain by two phased clocks that can be 180 degrees out of phase from each other. The different segments may therefore be operated at a divided scan clock frequency, for example.

Figure 1:
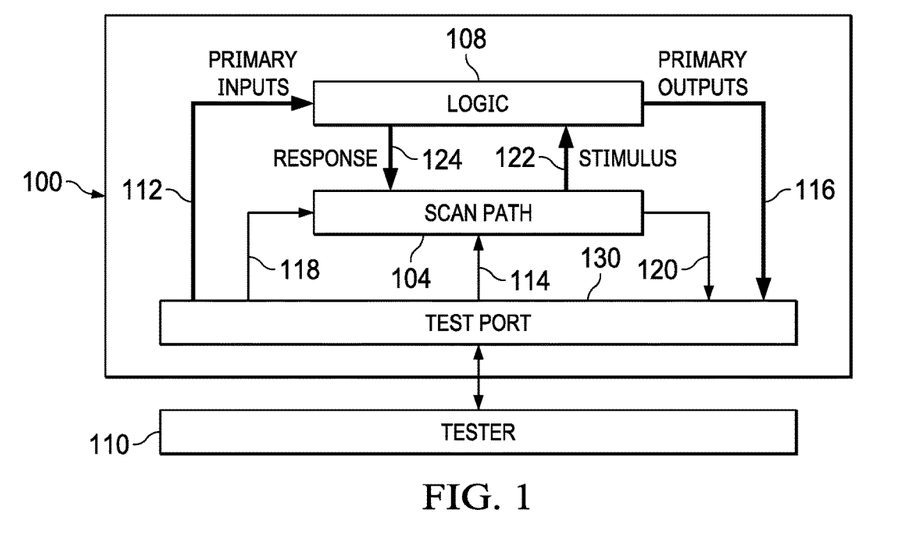
FIG. 1 shows a block diagram of a circuit device with a scan path in accordance with various examples.

FIG. 1 shows a block diagram of a simplified scan architecture, according to one example, illustrative of how a circuit 100 may be configured with a scan path 104 during test of circuit 100. Circuit 100 may be a functional circuit within a single integrated circuit, or within possibly multiple integrated circuits as a multi-chip module or System On Chip (SoC). Scan architectures can be applied at various circuit levels. For example, the scan architecture of FIG. 1 may represent the testing of a complete circuit, or it may represent the testing of an embedded Intellectual Property (IP) core circuit device within a circuit, such as a Digital Signal Processor (DSP) or CPU core.

The scan architecture may include a scan path 104 in which a plurality of scan chains exist. Logic 108 represents a circuit or DUT, and can be combinatorial logic. Logic 108 is coupled via paths 112, 114, 116, 118 and 120 to a tester 110 through a test port 130. Tester 110 operates to: (1) operate scan path 104 via control path 114; (2) output a test stimulus pattern to scan path 104 via scan input path 118; (3) receive a test response pattern from scan path 104 via scan output path 120; (4) output a test stimulus pattern to logic 108 via primary input path 112; and (5) receive a test response pattern from logic 108 via primary output path 116. Scan path 104 operates to output a test stimulus pattern to logic 108 via path 122, and to receive a response pattern from logic 108 via path 124.

Test port 130 may represent a Test Access Port (TAP) controller circuit of Institute of Electrical and Electronics Engineers (IEEE) standard 1149.1, or a TAP having a Boundary Scan Architecture (BSA), of Joint Test Action Group (JTAG). Alternatively, the scan controller of test port 130 may represent a Boundary Input/Output Serializer (BIOS) circuit.

The primary input path 112 and primary output path 116 connections may be achieved by augmentation of the scan path 104. For example, a boundary scan cell can be provided by widening a bus of the stimulus and response paths 122 and 124. In some instances, logic 108 may be sufficiently tested by scan path 104 so that it is unnecessary to provide primary input/output paths 112 and 116 to and from, respectively, logic 108 via the tester 110 or via the above described augmentation. Logic 108 can therefore be sufficiently tested using only scan path 104.

Figure 2:
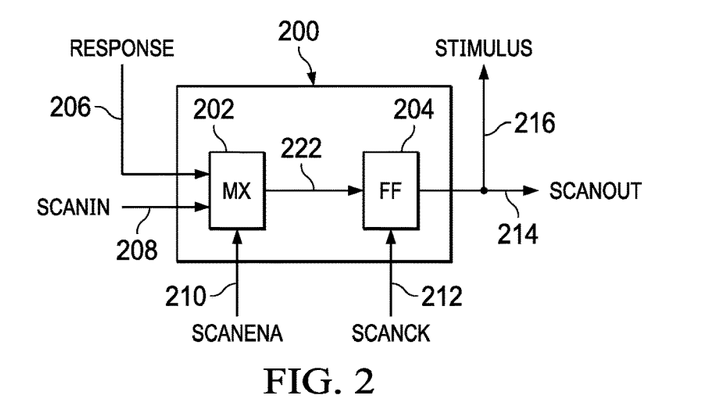
FIG. 2 shows a block diagram of a scan cell in accordance with various examples.

FIG. 2 illustrates an example of a scan cell 200 that may be used in scan path 104. The scan cell 200 can have a storage device flip-flop 204, such as a D-type flip-flop (D-FF), and a multiplexer 202. Since scan cell 200 contains a storage device flip-flop, scan cell 200 can alternatively be referred to as a memory element. Multiple memory elements or scan cells 200 connected in series forms a scan chain. In a normal configuration of the circuit 100, multiplexer 202 and D-FF 204 receive control inputs scan enable (SCANENA) 210 and scan clock (SCANCK) 212 to receive response data on path 206 from logic 108. Scan cell 200 can also output stimulus data to logic 108 via path 216. In a test configuration of the circuit 100, multiplexer 202 forwards the test pattern along scan path 222 to D-FF 204 of each scan cell 200. Multiplexer 202 receives SCANENA 210 and SCANCK 212 to capture response data from logic 108 via path 206, shift the test pattern from test port 130 via scan in (SCANIN) 208 to scan out (SCANOUT) 214, and apply stimulus data to logic 108 via path 216. In the test configuration, the scan clock (SCANCK) 212 to D-FF 204 is the scan clock principally derived from the tester 110 via control path 114. The scan clock 212 can also be derived from another source, such as a functional clock source.

A simplified example of how tester 110 may operate the scan architecture during tests begins by tester 110 sending control signals on control path 114. Those control signals may place the scan architecture in an operate scan path state, which causes the scan path 104 to accept the test vector stimulus data as SCANIN 208. Meanwhile, response data can be sent from scan path 104 after being shifted, as SCANOUT 214. From the operate scan path state, the tester 110 may also output control signals on control path 114 to place the scan architecture in a capture response data state. In the capture response data state, response data is loaded from combinatorial logic 108 via response path 124.

SCANENA and SCANCK output signals are sent to scan path 104 during scan and capture operations. In a rising edge, or low-to-high transition, on SCANENA, in combination with SCANCK transitions, stimulus data from the tester 110 can be input to the scan path 104 while response data is output from the scan path 104 back to the tester 110. A falling edge, or high-to-low transition, on SCANENA, in combination with SCANCK transitions, causes response data from logic 108 to be loaded into the scan path 104. The SCANCK thereby dictates the rate at which SCANIN test vector data is input onto the scan path 104, and specifically onto each of the plurality of scan chains.

SCANIN 208 and SCANOUT 214 of multiple memory elements, or scan cells, 200 are connected to form the serial scan chain of scan path 104. Scan architectures can have multiple scan chains connected in parallel to receive the test vector data. During scan operations through each scan chain, the output of the stimulus path 216 from each scan cell 200 can "ripple." Since the stimulus path 216 is connected to the scan output (SCANOUT) path 214, this ripple may cause all the inputs of logic 108 to actively change state during the operate scan path state. Rippling the inputs to logic 108 causes undesirable power consumption by the interconnect and gating capacitance in logic 108.

One method to reduce the power consumption during a test scan operation is to reduce the scan clock rate. However, by reducing the frequency of a scan clock (SCANCK), the test time and application time increases. In self-test, or push-button scan insertion tools, test time is limited to a specified interval during the application. Increasing the test time may therefore prove inadequate in certain self-test or push-button scan operations.

An alternative method is to divide each scan chain into segments. One segment may be clocked at a time, and thus only one segment undergoes a latching or shifting of the test vector data. This decreases overall power consumption by limiting consumption to only the active segment. However, additional counter logic may be needed as well as additional multiplexers and clock enable selection circuits for each segment. Also, undesirable clock divergence on the clock tree can occur, adding to the local voltage drop and Static Timing Analysis (STA) clock divergence.

Figure 3:
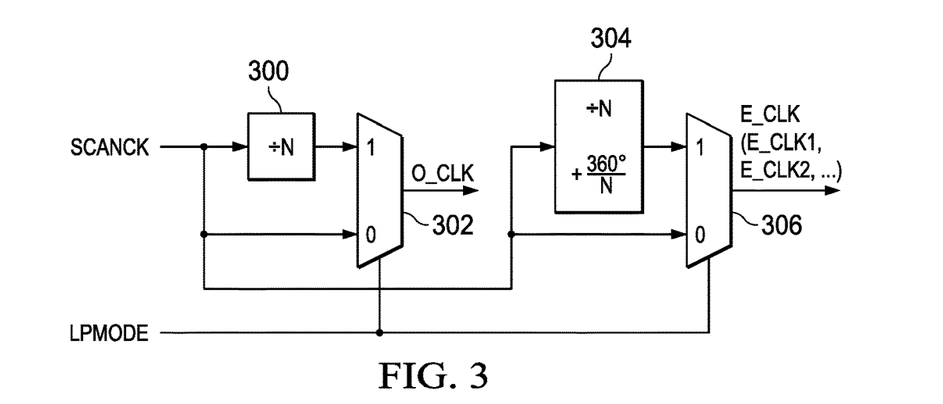
FIG. 3 shows a block diagram of an even and odd clock generation circuit in accordance with various examples.

FIG. 3 illustrates a synthesized clock generation circuit to achieve a low power, segmented scan architecture operation. The scan clock (SCANCK) can be divided to produce an odd clock (O_CLK) and an even clock (E_CLK) when the clock generation circuit is placed in a low power mode (LPMODE). The block diagram of an even and odd clock generation circuit, according to the example of FIG. 3, illustrates a clock divider 300 that may divide the scan clock by an integer N value. The integer N value may be greater than one and may be equal to $2^x$, where x is an integer number of at least one. The integer value of N can be determined by the number of segments in which each scan chain is divided. For example, if each scan chain is divided into two segments, then N can be equal to two.

The divided scan clock at the output of clock divider 300 may be coupled to multiplexer 302. When in low power mode of operation, LPMODE signal is sent to multiplexer 302, which then selects the 1 input and generates the odd clock (O_CLK). If the low power mode is not undertaken, then the 0 input is taken and scan clock and the odd clock become the same. As shown, the scan clock can also be sent to a clock divider followed by a phase delay circuit 304. The scan clock is divided by the same amount N as the odd clock; however, the scan clock after being divided is phase shifted. The phase shift is substantially equal to the odd clock divided by the integer N value. There may be a deviation on the phase shift that is unintended, and thus the phase shift that is intended may be different from the odd clock divided by N. However, it is intended that the phase shift is equal to the odd clock divided by the integer N value.

Upon receiving the low power mode enable signal, multiplexer 306 can select the output from the divider and delay circuit 304 to produce an even clock (E_CLK). If the test architecture is not placed in a low power mode, and LPMODE signal is not sent, and thus the odd and even clocks from multiplexers 302 and 306 are not generated, then the odd and even clocks are the same as the scan clock, with no phase delay taking place. However, if no clock division and phase delay are applied to separate segments of each scan chain, lower power consumption is not necessarily achieved.

The block diagram of FIG. 3 therefore illustrates the option of placing the scan architecture in a relatively low power consumption mode or one that does not achieve relatively low power consumption. If in the low power mode, separate segments of each scan chain are clocked by odd and even clocks, where the latching of one scan chain is delayed from that of the other, albeit both segments of the scan chain can be clocked at a lower rate to achieve lower power consumption. If the scan clock rate is made purposefully higher, or faster, yet the odd and even clocks are at, e.g., half the increased scan clock rate, the test time can nonetheless be reduced without significantly increasing the maximum power consumption of the logic 108 being tested. This proves beneficial in self-test scan architectures using push-button scan insertion tools that limit the overall test time and application time.

Figure 4:
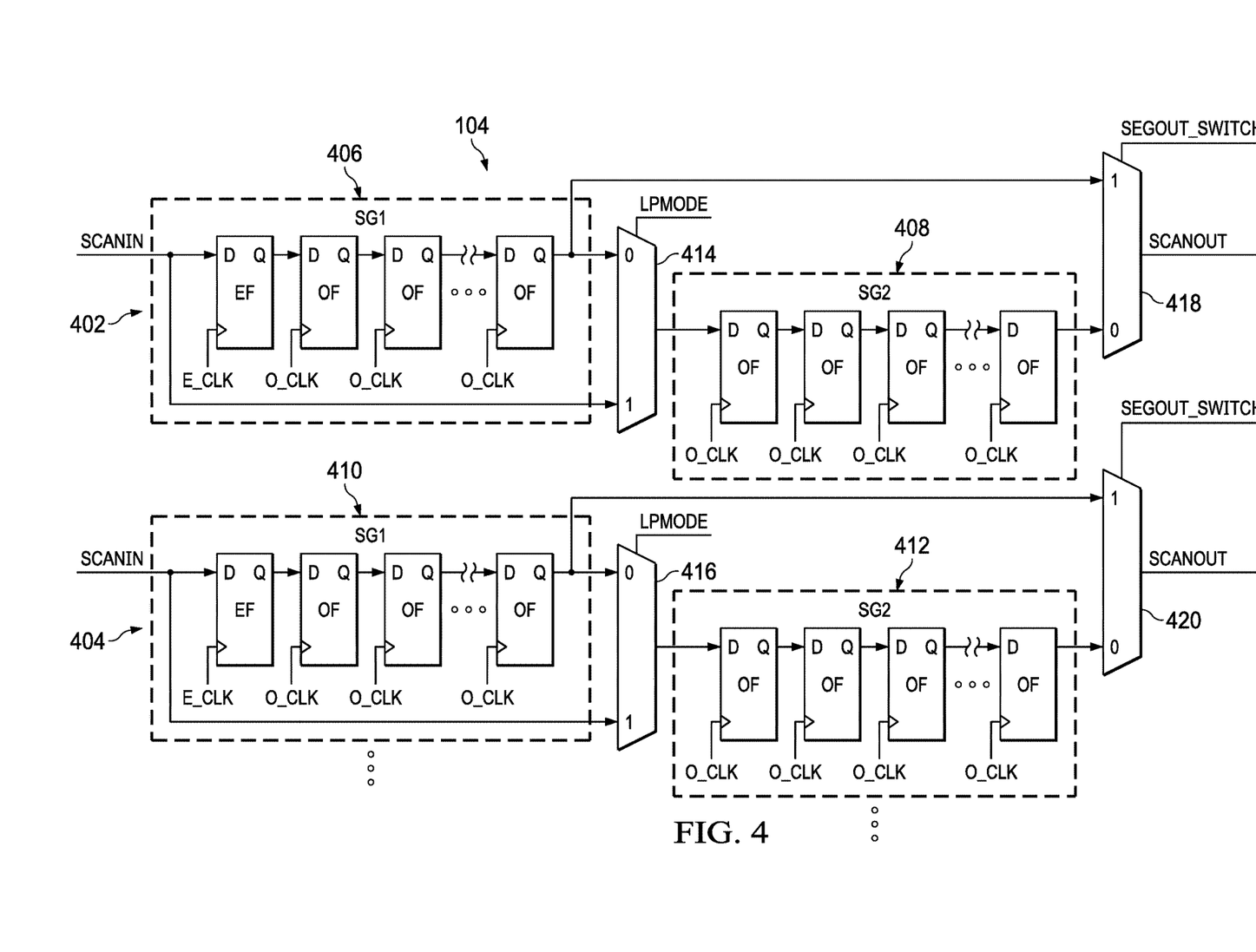
FIG. 4 shows a block diagram of memory elements for at least two segmented scan chains in accordance with various examples.

FIG. 4 is a more detailed block diagram of scan path 104, according to one example. In this example, a test vector sent from the external tester 110 via, e.g., a decompressor, separates the stream to different data and control paths based on the test protocol supported by test port 130. The protocol used to compress and decompress test vector data and results data may be currently known and set forth in IEEE standard 1149.1, 1149.7, BIOS, etc., or a later developed protocol.

After decompression, for example, multiple SCANIN test vector data can be sent across a plurality of internal scan chains, oftentimes referred to as STUMPs. Internal scan chains, or STUMPs, are those between the decompressor and the compressor, or compactor. In the example of FIG. 4, two internal scan chains 402 and 404 are shown. However, the scan architectures that utilize internal scan chains after the decompressor can have more than two internal scan chains, and in some instances several dozen or more. Also, in the example shown, each internal scan chain 402 and 404 comprises eight scan cells with corresponding eight memory element D-FF flip-flops marked "EF" or "OF" depending on whether that memory element receives an even clock or an odd clock. Each internal scan chain 402 or 404 configured between a decompressor and compressor, or codec, may contain several dozen, several hundred, or even several thousand flip-flops such as D-FFs. Each internal scan chain 402 or 404 may also be divided or segmented, into several smaller chains.

In this example, internal scan chains 402 and 404 are each divided into a first segment (SG1) 406 and 410 and second segment (SG2) 408 and 412. The first scan cell or memory element (head element) in the first segment 406 and 410 can be coupled to receive an E_CLK. All other memory elements in the first and second segments 406, 408, 410 and 412 can receive the O_CLK.

Each internal scan chain 402 or 404 is also shown to include mode multiplexer 414 and 416 between the first segments 406 and 410 and the second segments 408 and 412. Switch output multiplexers 418 and 420 can be used to select between outputs from the first segment SG1 and outputs from the second segment SG2.

When in the low power mode (LPMODE), mode multiplexers 414 and 416 forward the SCANIN test vector data to the second segments 408 and 412, respectively. Since the odd clock (O_CLK) is not delayed relative to the even clock (E_CLK), the SCANIN bits are loaded first into the second segments 408 and 412 and then into the first segments 406 and 410. The delay in loading the first segments 406 and 410 relative to the second segments 408 and 412 is achieved due to the even clock delay relative to the odd clock, and that the even clock is placed on the first memory element within the series of memory elements of the first segment, hereafter referred to as the head elements. Mode multiplexers 414 and 416 ensure that when placed in the LPMODE the second segments 408 and 412 are loaded first with the first bit B0, followed by loading the second bit B1 into the first segments 406 and 410. This loading continues for all bits within the test vector.

The switch output multiplexers 418 and 420 are controlled by a SEGOUT_SWITCH to select the corresponding second segments 408 and 412 first, then the first segments 406 and 410 second. If the LPMODE is not selected, then input 0 of mode multiplexers 414 and 416 are chosen to signify a standard mode of operation. In a standard mode of operation, the first and second segments of each scan chain are connected in series. In the low power mode, or LPMODE, with the proper inputs of mode multiplexers 414 and 416 selected, the test vector data applied to scan chain 402 is rippled through one segment 406 or 408 that is one half of scan chain 402. The same applies to segments 410 and 412 being only one half of scan chain 404. Thus, power dissipation caused by the rippling of data can be reduced by half for each internal scan chain.

Figure 5:
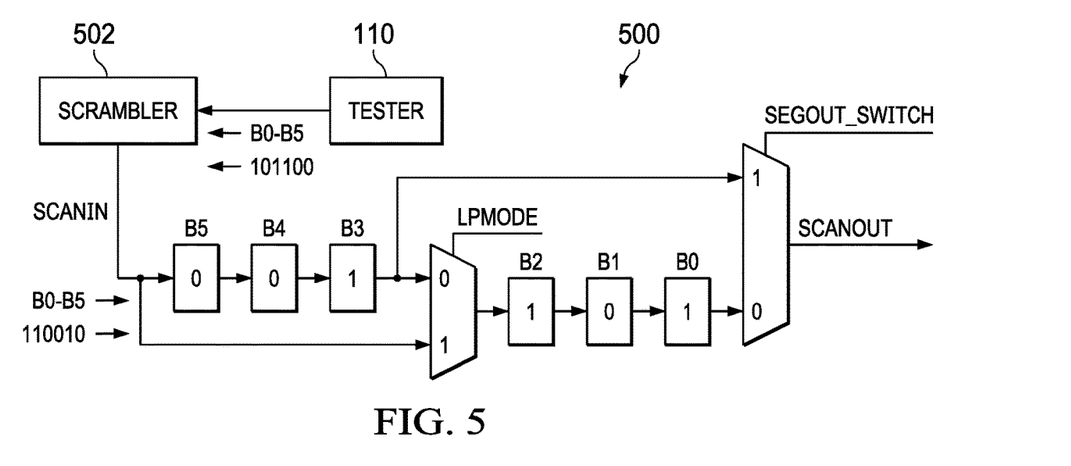
FIG. 5 shows a block diagram of the memory elements of a scan chain receiving a scrambled bit stream in accordance with various examples.

FIG. 5 illustrates how test vector data can be shifted via a decompressor through a single internal scan chain 500 from tester 110. Due to the manner in which the test vector data is divided between two segments, such as segments 406 and 408 of internal scan chain 402, the test vector data may be scrambled prior to shifting. A scrambler 502 is therefore placed between tester 110 and each internal scan chain. FIG. 5 illustrates only one scan chain of possibly numerous scan chains. For sake of brevity, only one scan chain 500 is shown, and only six scan cells or memory elements are shown. However, it is understood that several dozen, if not hundreds, of internal scan chains and scan cells/memory elements, can be implemented in this scan architecture. For simplicity in showing the scrambling technique, and due to the manner in which the test vector is divided between the two segments, bits that are intended for an odd segment 408 and corresponding odd clocked D-FF (OF) can be merged with the bits intended for the first segment 406 having even clocked D-FF as its head element.

For example, if the Automatic Test Pattern Generation (ATPG) input tool determines that a test vector of 101100 serial pattern for internal scan chain 500 is needed to test the logic that is coupled to scan chain 500, the pattern must first be scrambled to a pattern of 110010, as shown. Since the even segment, or first segment, is delayed in its load relative to the odd segment, or second segment, the first bit value of B0 is loaded first into the odd segment. The second bit B1 is then loaded into the even segment so that the bits, after scrambling, are loaded as shown in FIG. 5. However, since SEGOUT_SWITCH first loads the second segment or the odd segment, followed by the first segment or even segment, the bits that are scrambled and then shifted into the scan chain 500 are nonetheless read out in their proper order prior to scrambling, as 101100.

The addition of a mode multiplexer, such as multiplexer 414 on scan chain 402, not only adds one multiplexer to each scan chain, but the segment output switching multiplexer 418 requires another multiplexer in order for it to properly align the outputs of one segment relative to the other. Each internal scan chain uses a head element flip-flop EF. For example, if the IP is a Digital Front End (DFE) type IP of an IP core, having, for example 810 internal scan chains, then 1620 multiplexers may be needed, and 810 head elements would also be required. Whatever the protocol for the IP core, General Electronics Module (GEM), Version 4 Routing (R4), etc., the number of multiplexers may be twice the internal scan chains, and the head element flip-flops (EFs) may be equal to the number of internal scan chains. The added multiplexers and head elements significantly increases the amount of chip area needed and also increases the routing and congestion to those multiplexers and D-FFs.

The low power scan architecture thus far is descriptive of using at least two multiplexers 414,418 for each scan chain between a decompressor and compressor, alternatively an internal scan chain. There can be hundreds of internal scan chains within the compressor/decompressor, or codec, thus adding several hundred or more multiplexers and routing area to and from the multiplexers when designing for a low power mode (LPMODE) operation. Moreover, each of the grouped or segmented internal scan chains may need a head element, or flip flop, and even/odd clock routing to each head element possibly different from the remaining memory elements subsequent to the head memory element within the segmented chain.

Figure 6:
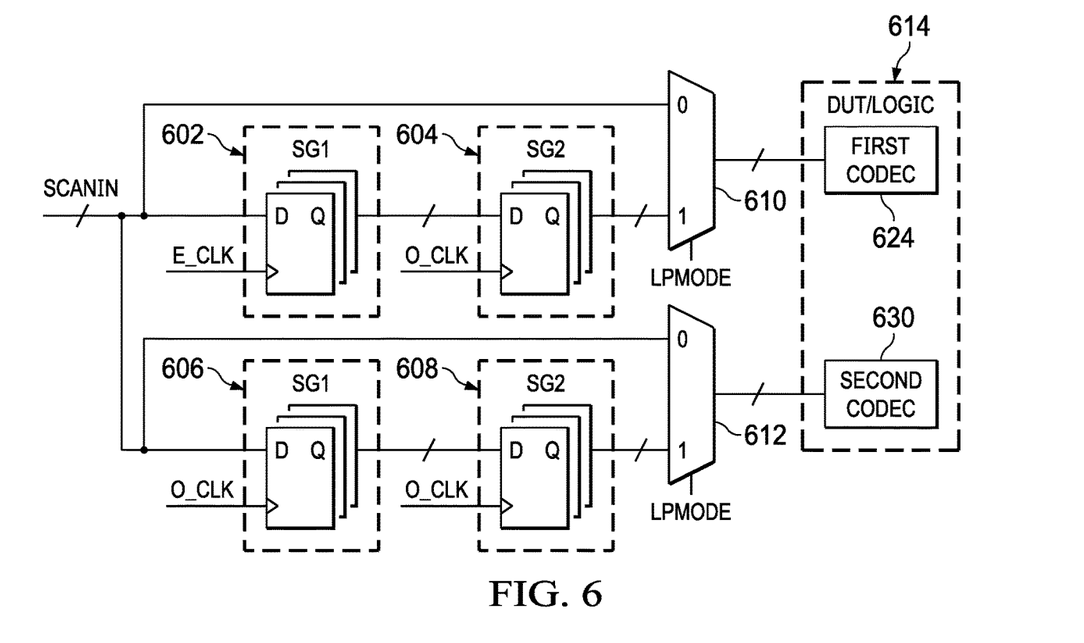
FIG. 6 shows a block diagram of the memory elements of a plurality of segmented scan chains receiving the even clock on a head element of a first segment and the odd clock on all remaining memory elements of the other segments in accordance with various examples.

FIG. 6 provides a more beneficial scan architecture in which the mode multiplexers or segment out switch multiplexers can be substantially eliminated by arranging external scan chains external to the codec, hereinafter simply referred to as scan chains. The internal scan chains between the decompressor and compressor avoid multiplexers or segmented internal scan chains. The number of head element D-FFs on the scan chains external to the codec that receive the even clock is reduced. For example, if the bus containing the SCANIN signal before decompression (i.e., before entry into a decompressor) is eight bits wide loaded into the first segment 602 of a plurality of first (external) scan chains and then as another eight bit wide bus loaded serially through second segment 604 of the plurality of first scan chains, eight multiplexers 610, 612 may be needed to select the LPMODE for placement onto partitioned logic 614. The same may apply when loading SCANIN before decompression into the first segment 606 of a plurality of second (external) scan chains and then the second segment 608 of the plurality of second scan chains loaded onto partitioned logic 614. Instead of twice the number of multiplexers and a head element for each of the plurality of internal scan chains if placed after a decompressor, the scan architecture of FIG. 6 may only require eight multiplexers and sixteen head elements in an eight bit bus of scan chains before partitioned logic containing the codecs if logic 614 is separated into two partitions, each with a dedicated codec 624 and 630. The following savings in chip or die area can be achieved using a phase controlled dual codec block scan architecture instead of, for example, a frequency scaled segmented scan architecture with multiplexers and head elements placed on the internal scan chains or STUMPs:

TABLE 1

| TYPE OF IP | AREA SAVINGS |
|---|---|
| DFE | 24% |
| GEM | 23% |
| R4 | 20% |

In the block diagram of FIG. 6, a plurality of first scan chains are coupled in parallel along a first bus that extends from the first segment 602 of memory elements to the second segment 604, and then to the first codec 624. A plurality of second scan chains are coupled in parallel along a second bus that extends from the first segment 606 of memory elements to the second segment 608, and then to the second codec 630. Each of the plurality of first and second scan chains comprise a series-connected set of memory elements, and wherein a first memory element within each of the series-connected set of the first scan chains comprises the head element. The even clock is applied to the head element, and the odd clock is applied to all other memory elements exclusive of the head element. The even and odd clocks are provided to groups, or segments, of series-connected memory elements arranged in scan chains external to the internal scan chains within codecs 624 and 630. The even clock can be applied to a head element within a segment of memory elements coupled to the bus upon which a test pattern can be sent, and prior to a decompressor within codecs 624 and 630. The segmented memory elements arranged before the codecs 624,630 avoid introducing LPMODE multiplexers on both the scan chains prior to codecs 624, 630 and internal scan chains within codecs 624,630. Moreover, head elements and routing to head elements within codecs 624, 630 to accommodate dissimilar phase clocks is minimized since the internal scan chains avoid segmentation, and frequency scaled segmentation. Avoiding routing to and from multiplexers and head elements within the numerous decompressed internal scan chains in favor of lessened routing to fewer minimal multiplexer and head elements on the external bus of the scan chains before decompression saves substantial area as noted above.

Figure 7:
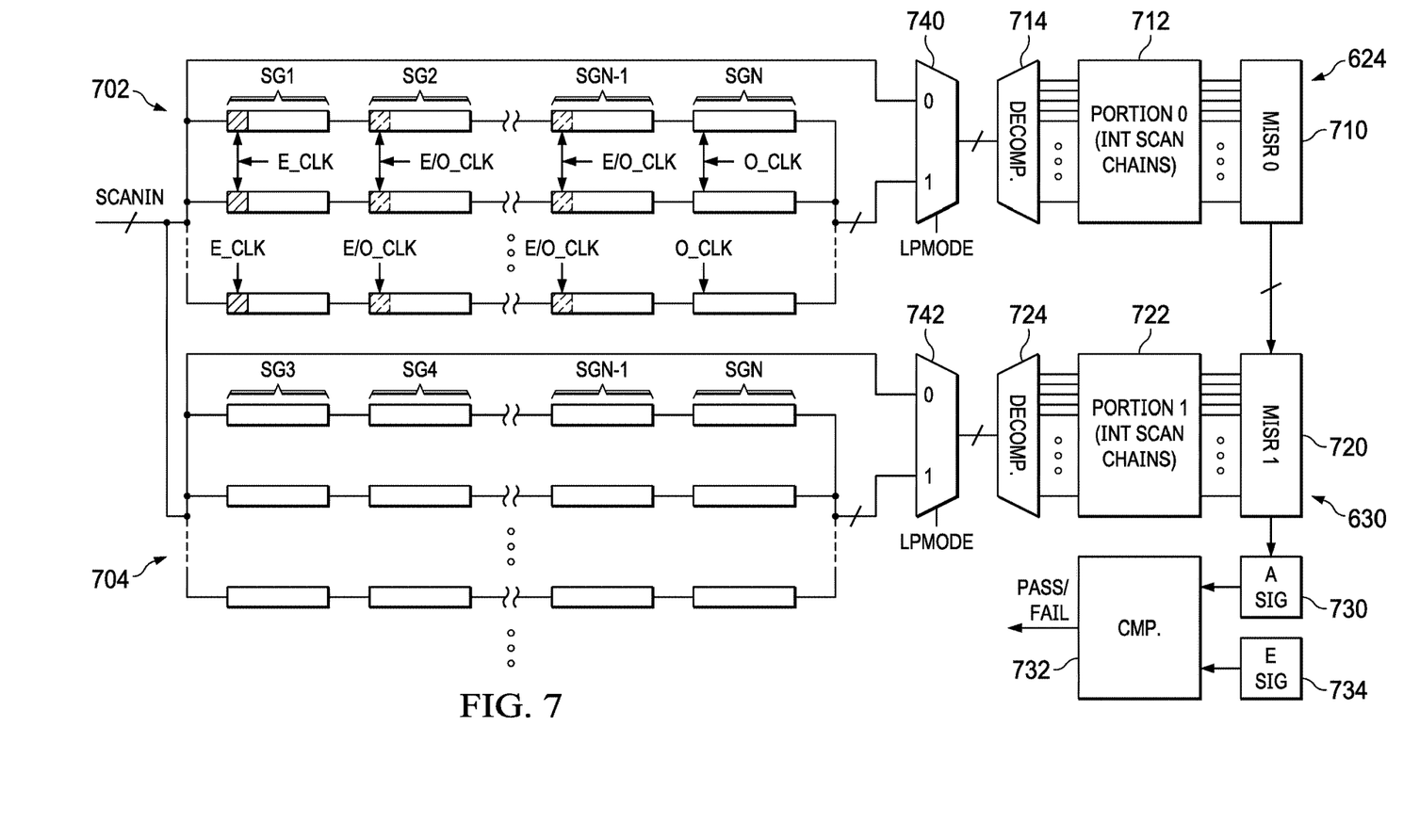
FIG. 7 shows a block diagram of the segmented scan chains having incoming test vector data latched in a low power mode by odd and even clocks into a partitioned logic circuit, each having a dedicated codec in accordance with various examples.

FIG. 7 illustrates in greater detail a plurality of first scan chains 702 coupled to shift a test vector, with a phase delay of an even clock relative to the odd clock, onto first codec 624. A plurality of second scan chains 704 are also coupled to shift the test vector with substantially no phase delay on rising edges of the odd clocks onto the second codec 630. Both the first codec 624 and the second codec 630 involve what is known as scan compression. Scan compression is generally described as a way of reducing the volume of scan bits sent to a circuit device or logic being tested. Scan compression architectures include components such as a compactor (or compressor), stumps and a decompressor. Shown in FIG. 7, the compressor, STUMPs and decompressor for codec 624 are labeled 710, 712 and 714, respectively. Likewise, the compressor, STUMPs and decompressor for the second codec 630 are labeled 720, 722, and 724, respectively.

Decompressors 714 and 724 operate similar to each other and by decompressing channel data from respective first and second plurality of scan chains 702 and 704 into internal scan in data to multiple internal scan chains, or stumps. There are different types of decompressors 714, 724 available. A popular type of decompressor can include an exclusive or (XOR) decompressor, a multiplexer/demultiplexer decompressor, or a Linear Feedback Shift Register (LFSR) decompressor. The internal scan chains can oftentimes be referred to as self-test internal smaller scan chains for scan-ins/scan-outs. STUMPs 712 and 722 are the internal scan chains of respective first and second portions of a circuit device, or logic. The separate portions can have, for example, different or common clock domains, voltage domains, or a hardware portion of the internal scan chains that share a dedicated decompressor or compressor.

Compressors 710 and 720 associated with the first portion STUMPs 712 and second portion STUMPs 722 are often referred to as compactors. There are different compressor architectures available in the industry, such as XOR compressors and Multiple Input Signature Registers (MISR) compressors. As shown in FIG. 7, compressors 710 and 720 can be MISR compressors that receive compacted internal scan out channels as actual signatures 730. Actual signatures 730 are generated by concatenating multiple inputs from MISR 710 placed or loaded as test response values in parallel from the internal scan chains or STUMPs 712, 722. Those test response values are integrated with a value of a current state of the MISR 710, and the integrated response values are concatenated with the response values from MISR 720 for generating the actual signature 730. The actual signature 730 can be compared by a comparer 732 to an expected signature 734. The expected signature 734 can be generated from, for example, a signature simulation tool that generates both intermediate and final expected signatures for a particular test. These intermediate and final signatures can be the expected signatures, or "golden signatures," which are then compared to the actual signatures generated by the test. A description of MISR registers and the comparison of actual signatures and expected signatures are set forth in U.S. Pat. No. 6,681,357, herein incorporated by reference.

If the actual signatures 730 compare favorably to the expected signatures 734, then comparer 732 will produce a pass signal indicating the circuit device or logic has passed the test either during manufacture of the circuit device (e.g., at wafer probe) or in the field. If the comparison is unfavorable, then the wafer, and specifically a particular die on that wafer, can be rejected. Or, if tested in the field, the boot-up process can be discontinued and an error can be displayed to the user. A benefit in using MISR signatures, and specifically MISR compressors 710 and 720, is that a signature simulation tool can be used to quickly determine pass/fail status of the test. Also, by partitioning a circuit, or circuit module or system module, each with a dedicated compressor and decompressor, the MISR signature can be concatenated from one codec block to the other, such as from codec block 624 to codec block 630, to quickly observe pass/fail status of the entire circuit undergoing test. Maintaining blocks, and codecs 624 and 630 dedicated to each partitioned block, multiple routing going to and from each codec can be minimized.

The number of portions of a circuit device, or logic, undergoing tests is at least two. There can be more than two portions and corresponding STUMPs 712 and 722. There also can be more than two segments for each of the plurality of first scan chains 702, and each of the plurality of second scan chains 704. If there are two segments, e.g., SG1 and SG2 then the even clock (E_CLK) is applied to head element of SG1, and the odd clock (O_CLK) is applied to the head element as well as all other memory elements of the second segment. The O_CLK would be applied to all remaining memory elements serially connected downstream after the head element within the first segment. The E_CLK, however, need only be applied to the head element within the first segment of the plurality of first scan chains as marked in cross-hatch. That plurality of first scan chains are coupled to multiplexer 740 if the LPMODE is selected. The output from multiplexer 740 is then placed on a bus coupled onto decompressor 714.

There may be more than two segments, if desired. For example, if the number of segments equals N, then E-CLK can be placed on the head memory element of segments SG1, SG2, and SGN−1. The O_CLK is applied to all remaining memory elements within those segments, as well as all memory elements of the last segment, or SGN−1.

The plurality of second scan chains 704 in FIG. 7 are shown without any cross-hatched, or phantom-dashed, cross-hatched head elements that might receive an E_CLK. Thus, all memory elements in the second scan chain 704, regardless of how many segments are employed, receive an O_CLK. A multiplexer 742, if enabled in the LPMODE, transfers the latched and shifted SCANIN on the multibit bus onto the decompressor 724 of the second codec 630.

Figure 8:
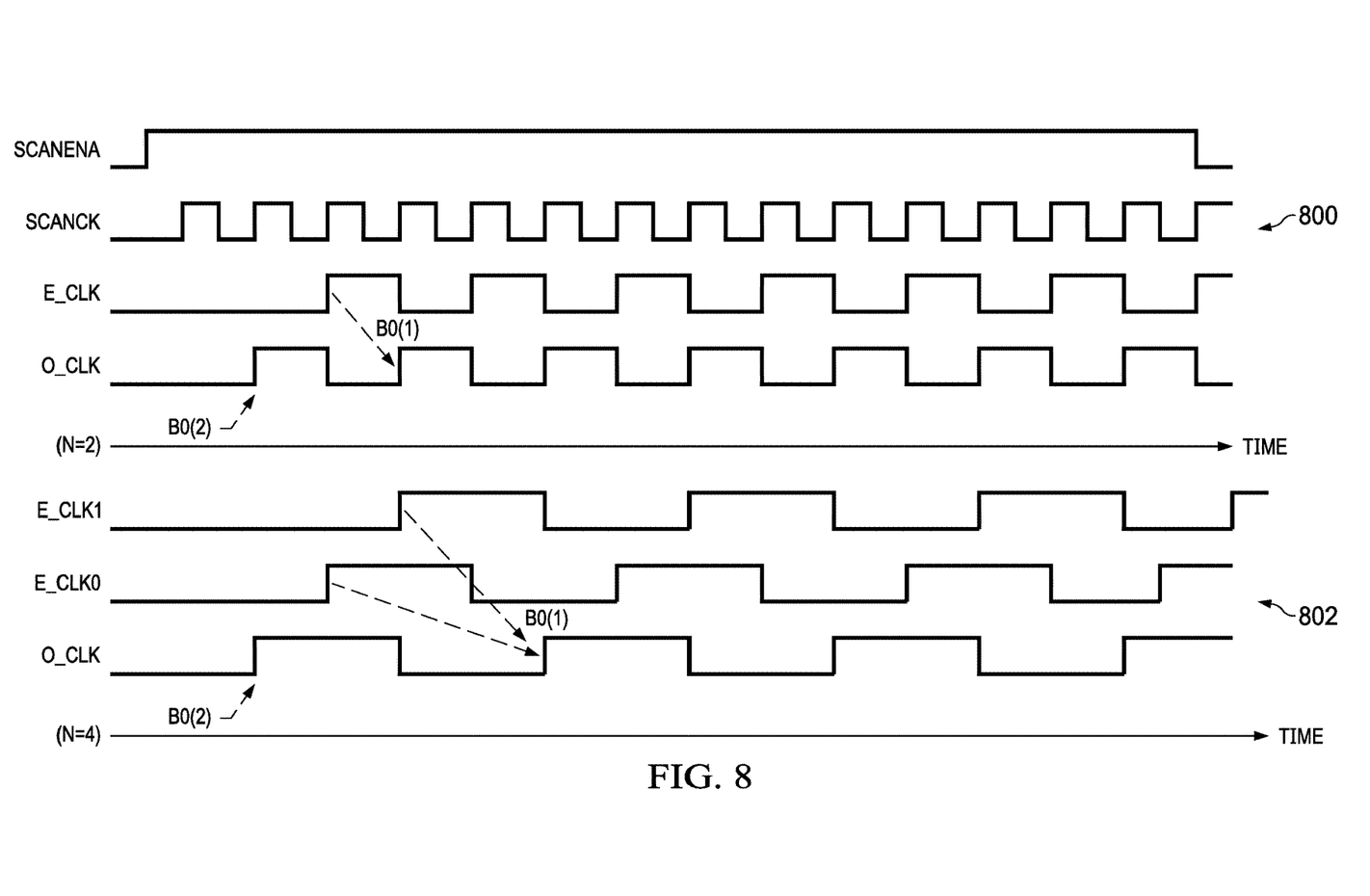
FIG. 8 shows a timing diagram of different phase delays among different segmented scan chains in accordance with various examples.

FIG. 8 shows a timing diagram 800 of a phase delay of an even clock (E_CLK) relative to O_CLK if N=2, and another timing diagram 802 of a phase delay of possibly two even clocks (E_CLK1 and E_CLK0) from O_CLK if N=4. Taking the example timing diagram 800, if N=2, both the E_CLK and O_CLK are shown at half the frequency of the scan clock, with the E_CLK delayed from the O_CLK by an amount of one cycle of the O_CLK divided by two. The 180° phase delay of the E_CLK, when applied to a plurality of first scan chains, and specifically the head element of the plurality of first scan chains, ensures the SCANIN bits are loaded and thereafter loaded an intended delay amount on to the next O_CLCK. For example, the first bit of a plurality of second scan chains, B0(2) is loaded one cycle before the first bit of a plurality of first scan chains, B0(1).

In the example of timing diagram 800, a dual codec based low power scan occurs when the loading of the first plurality of scan chains are delayed in phase from the plurality of second scan chains. The first and second codecs are therefore loaded at different times with the same test vector at a reduced speed compared to the scan clock. The shifted test vector therefore remains static for a longer period of time as it is shifted through the scan chains of the memory elements. Maintaining a static state for a longer period of time can therefore reduce the scan shift power consumption. Moreover, segmenting the plurality of scan chains also can reduce the power consumption ripple effect. If the scan clock frequency is increased, the even and odd clocks also increase in frequency, but still maintain a relatively longer static time to perform the scan shift. For example, if the scan clock is increased two fold, a 50% reduction in test time can occur with a marginal increase in power consumption.

The timing diagram 802 in FIG. 8 also illustrates more than possibly two segments for each of the plurality of scan chains. If four segments (N=4) are used, then there may be more than one E_CLK. Also, the scan clock frequency would be divided by more than two, and can be divided by four, for example. The E_CLK frequency remains the same as the O_CLK frequency, and regardless of the number of E_CLKs, the load shift of one plurality of scan chains into a first of possibly many codecs is delayed as shown by B0(1), relative to B0(2).

Figure 9:
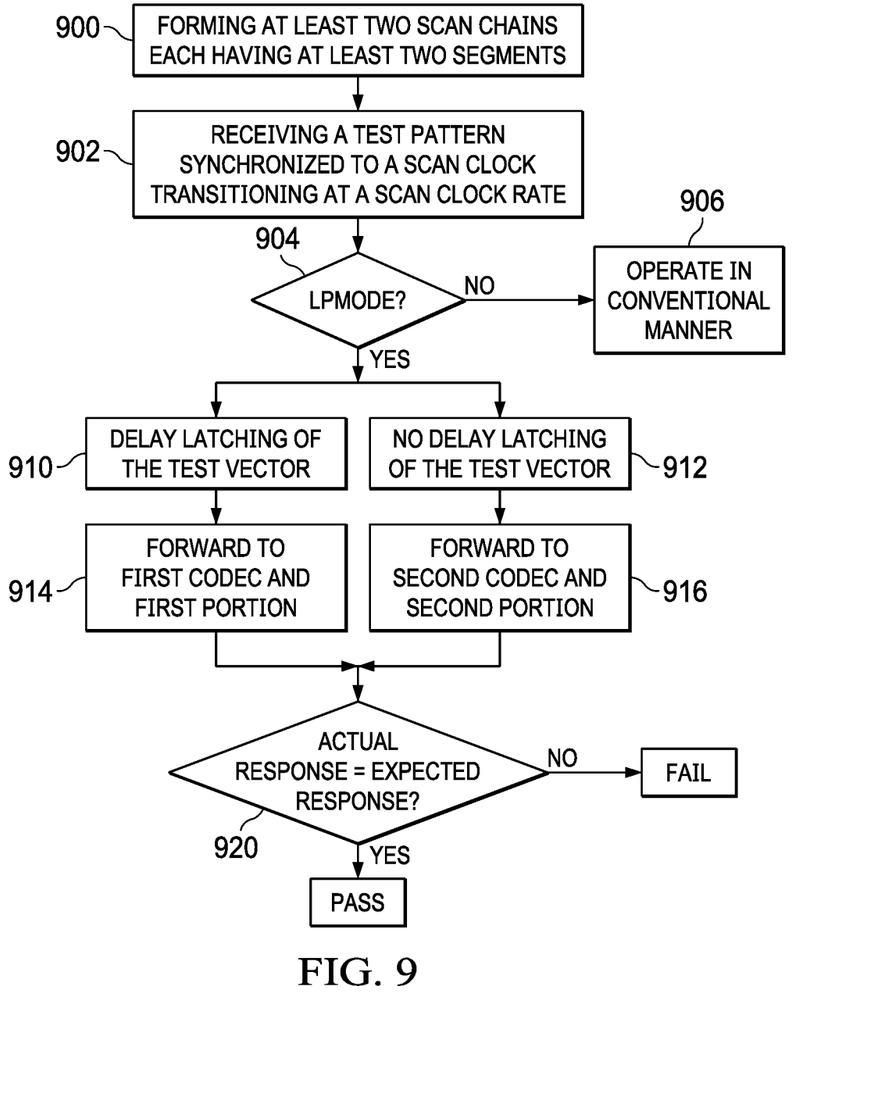
FIG. 9 shows a flow diagram of the operation for phase control testing of a logic circuit partitioned with separate and distinct codecs in accordance with various examples.

FIG. 9 shows a flow diagram of scan chain operation and specifically the plurality of clock scan chains, each having segmented memory elements, with a head element clock by a divided and delayed E_CLK. The plurality of scan chains are different from the internal scan chains of corresponding dual and multi-codecs. Since the plurality of scan chains are shifted in parallel through a plurality of series-connected memory element, the scan chains are sometimes referred to as clock scan chains. However, for purposes hereof, they are simply referred to as scan chains that are different from the internal scan chains, or STUMPs, of the partitioned DUT or logic.

The plurality of first and second scan chains can be formed 900, each having at least two segments. The memory elements of each scan chain are coupled in series and can include D-FFs, S-FFs, JK-FFs, or T-FFs. A test pattern is received 902, for example, by a test port and sent as a scan in signal, SCANIN, onto the plurality of scan chains. The test pattern can be synchronized to the scan clock having a first rate. During a low power mode of operation 904, the test vector data is loaded through and serially shifted from one memory element to the next, segment-by-segment, onto at least a pair of codecs. If the low power mode (LPMODE) is not selected, then the latching and shifting through segments of the plurality of scan chains is bypassed and the SCANIN is loaded into the codecs in a conventional manner 906.

If the LPMODE is selected, then the delay latching of the test vector occurs among the plurality of first scan chains 910, but preferably not the second scan chains 912. The delay latching and shifting of the test pattern in the plurality of first scan chains is then forwarded onto the first codec and the first logic portion 914, whereas the non-delay latching and forwarding of the plurality of second scan chains is applied to the second codec and second portion 916.

After placement upon the separate dedicated compressors, and thereafter through the separate STUMPs, of the first and second portions, and concatenating the compressed MISR output, the actual response signature is compared to the expected response signature. If the actual response signature is the same as the expected response signature derived from the signature tool, then the circuit device, or logic circuit being tested using two separate codecs and logic portions, is determined to be one that passes the test. If the actual response signature does not equal the expected response signature, then the circuit device undergoing test is determined to be a failure.

In the foregoing discussion and in the claims, the term "including" and "comprising" are used in an open-ended fashion, and thus should be interpreted to mean "including but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections.

An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value or delay amount.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
   a counter circuit configured to:
      receive a scan clock, wherein the scan clock transitions at a scan clock rate in which a test vector data is clocked onto scan input bus;
      divide the scan clock by N to produce an odd clock and an even clock; and
      delay the even clock by approximately one cycle of the odd clock divided by N, wherein N is an integer greater than one;
   a first plurality of external scan chains coupled to receive the test vector data from the scan input bus wherein the test vector data is configured to be clocked onto the first external scan chains by the even clock;
   a first portion of a logic circuit having a plurality of first internal scan chains arranged between a first compressor and a first decompressor to receive a shifted test vector data from the first external scan chains via the first decompressor;
   a second plurality of external scan chains coupled to receive the test vector data from the scan input bus, wherein the test vector data is configured to be clocked onto the second external scan chains by the odd clock; and
   a second portion of the logic circuit having a plurality of second internal scan chains arranged between a second compressor and a second decompressor to receive the test vector data from the second external scan chains via second decompressor.

2. The system of claim 1, wherein N equals $2^x$, where x is an integer number of at least 1.

3. The system of claim 2,
wherein respective ones of the first external scan chains include a number N segments that each include multiple memory elements, wherein a first memory element of each of the first N−1 segments of respective ones of the first external scan chains is clocked by the even clock, and wherein remaining memory elements of the first external scan chains are locked by the odd clock;
wherein respective ones of the second external scan chains include a number N segments that each include multiple memory elements, and wherein memory elements of the second external scan chains are clocked by the odd clock.

4. The system of claim 2,
wherein the first portion of the logic circuit is configured to output a first test output vector via the first compressor; and
wherein the second portion of the logic circuit is configured to output a second test output vector via the second compressor;
further comprising a comparator having a first input configured to receive an expected value and having a second input configured to receive the first and second test output vectors, the comparator configured to output a pass/fail value in response to comparing the first input and the second input.

5. The system of claim 2, wherein a first memory element of each of the first plurality of external scan chains comprises a head memory element.

6. The system of claim 5, wherein the head memory element is configured to receive the even clock.

7. The system of claim 6, wherein the each of the secondary plurality of external scan chains comprises multiple memory elements, and each of the memory elements is configured to receive the odd clock.

8. A method, comprising:
receiving a test pattern synchronized to a scan clock transitioning at a scan clock rate;
latching in a delayed test pattern across a plurality of first scan chains, wherein the delayed test pattern is the test pattern with a delay;
latching the test pattern across a plurality of second scan chains;
decompressing the test pattern from the plurality of first scan chains onto a first plurality of internal scan chains of a first portion of the logic circuit;
decompressing the test pattern from the plurality of second scan chains onto a first plurality of internal scan chains of a second portion of the logic circuit;
compressing the test pattern from the first and second plurality of scan chains as test response values; and
comparing the test response values to corresponding expected response values to determine pass or fail of a logic circuit.

9. The method of claim 8, further comprising dividing each of the plurality of first and second scan chains by a number of segments equal to N, wherein N is an integer greater than one.

10. The method of claim 8, further comprising dividing each of the plurality of first and second scan chains by two if each of the plurality of first and second scan chains comprises two segments.

11. The method of claim 8, further comprising:
forming an odd clock by dividing the scan clock by N, wherein N is an integer greater than one; and
forming an even clock by dividing the scan clock by N, and delaying the even clock by one cycle of the odd clock divided by N
wherein the latching in the delayed test pattern is performed using the even clock; and
wherein the latching in the test pattern is performed using the odd clock.

12. The method of claim 11, further comprising:
applying the even clock to a head memory element and the odd clock to remaining memory elements of the plurality of first scan chains; and
applying the odd clock to memory elements of the plurality of second scan chains.

* * * * *